United States Patent
Jeong et al.

(10) Patent No.: US 7,224,596 B2
(45) Date of Patent: May 29, 2007

(54) APPARATUS AND METHOD FOR REPAIRING SEMICONDUCTOR MEMORY DEVICE

(75) Inventors: Chang-Yeong Jeong, Suwon-si (KR); Hong-Sun Hwang, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 11/270,184

(22) Filed: Nov. 9, 2005

(65) Prior Publication Data
US 2006/0098503 A1 May 11, 2006

(30) Foreign Application Priority Data
Nov. 10, 2004 (KR) .................. 10-2004-0091221

(51) Int. Cl.
G11C 5/06 (2006.01)
G11C 7/00 (2006.01)
G11C 8/00 (2006.01)

(52) U.S. Cl. .................. 365/63; 365/200; 365/210; 365/230.03

(58) Field of Classification Search .................. 365/63, 365/200, 205, 207, 208, 230.03, 210
See application file for complete search history.

(56) References Cited

U.S. PATENT DOCUMENTS

| 5,608,668 A | 3/1997 | Zagar et al. ................ 365/149 |
| 6,920,057 B2* | 7/2005 | Honda et al. ................ 365/63 |
| 6,934,214 B2* | 8/2005 | Fujisawa et al. ....... 365/230.03 |

FOREIGN PATENT DOCUMENTS

| JP | 2000-090697 | 3/2000 |
| KR | 1996-0015903 | 5/1996 |

OTHER PUBLICATIONS

Patent Abstract of Japan for application No. 2000-090697.
Korean Patent Abstract for application No. 1996-0015903.

* cited by examiner

*Primary Examiner*—Trong Phan
(74) *Attorney, Agent, or Firm*—F. Chau & Associates LLC

(57) ABSTRACT

Apparatus and methods are provided for repairing semiconductor memory devices having an open bit line sense amplifier architecture with cell array blocks having memory blocks formed of edge sub-blocks, main sub-blocks, dummy sub-blocks. Row defects can be processed using a straight edge block when DQ data are outputted by enabling three word lines such that a repair process for the memory device in an edge sub-block or a dummy sub-block has the same repair efficiency as that of a case where defects occur in a main sub-block.

18 Claims, 16 Drawing Sheets

OPEN BIT LINE S/A

APPARATUS AND METHOD FOR REPAIRING SEMICONDUCTOR MEMORY DEVICE

CROSS-REFERENCE TO RELATED APPLICATION

This application claims priority to Korean Patent Application No. 2004-91221 filed on Nov. 10, 2004, which is fully incorporated herein by reference.

TECHNICAL FIELD OF THE INVENTION

The present invention relates to apparatus and methods for repairing semiconductor memory devices and, more particularly, to apparatus and methods for repairing semiconductor memory devices having open bit line architectures.

BACKGROUND

Generally, a redundancy device is a defect repair device that replaces a bit line connected to a possible defective cell of a cell array with a spare bit line. When an address corresponding to the defective cell is applied to a memory device, a normal path for selecting the defective cell is disconnected and the redundancy device operates to enable a bit line connected to a repaired cell so as to perform a redundancy operation.

The redundancy scheme is classified into either a row redundancy type or a column redundancy type according to the type of a spare memory cell used to replace a defective cell. The row redundancy technique replaces a defective cell with a spare row (or a redundant word line), and the column redundancy technique replaces a defective cell with a spare column (or a redundant bit line). The row redundancy technique is further classified as a folded bit line type or an open bit line type. In the folded bit line row redundancy technique, a bit line and a bit line bar, which are formed in one memory cell block, are connected to one sense amplifier. In the open bit line row redundancy technique, a bit line and a bit line bar, which are formed in different memory cell blocks, are connected to one sense amplifier.

FIG. 1 is a conceptual diagram illustrating a data output operation of a conventional memory device having a folded bit line sense amplifier. In FIG. 1, it is assumed that each bit line is connected to one sense amplifier (S/A). When a word line W/L corresponding to a row address is selected and a bit line corresponding to a column address is enabled, each S/A senses data through the enabled bit line and outputs the sensed data via a plurality of data pins DQ=0, 1, 2, 3, 4, 5, 6, 7. One cell array block (or memory bank) having a block A1 and a block B1 is illustrated in FIG. 1, and each of the blocks A1 and B1 includes 8K (K represents a number of 1,024) word lines W/Ls. A word line W/L whose row address is one of 0–8K is illustrated in FIG. 1.

Because one word line W/L is enabled within a refresh range of 8K in a normal W/L enable operation, two word lines W/L1 and W/L2 are enabled in one cell array block. Word lines W/Ls are enabled in all row blocks in the same way as above. Also, a row redundancy enable operation is processed in the same manner as the normal W/L enable operation.

When a row redundancy repair technique is applied to the conventional folded bit line sense amplifier, a defective W/L is replaced with a spare W/L on a 1:1 basis. For example, a spare W/L corresponding to a defective W/L is enabled in a refresh range of 8K in the same way as above, and thus two W/Ls are enabled.

However, in a memory device having an open bit line S/A architecture, a dummy bit line 20 exists at the last edge block of a memory bank. A dummy bit line processing method is generally classified into either a round edge block processing method or a straight edge block processing method. FIGS. 2 and 3 schematically depict a straight edge block processing method for processing a dummy bit line. In particular, FIG. 2 is a conceptual diagram illustrating a case where two word lines are enabled and thus eight DQ data are outputted by a memory device having a conventional open bit line sense amplifier, and FIG. 3 is a conceptual diagram illustrating a case where three word lines are enabled and thus eight DQ data are outputted by a memory device having a conventional open bit line sense amplifier. FIGS. 2 and 3 illustrate one cell array block having blocks A2 and B2, wherein each block A2 and B2 includes 8K word lines W/Ls.

Referring to FIG. 2, the block A2 includes a first edge sub-block 10 (that is, a left edge block) corresponding to row addresses X of 0–255 and a first main sub-block 20 corresponding to row addresses X of 256–8K. The block B2 includes a second edge sub-block 30 (that is, a center pseudo edge block) corresponding to row addresses X of 0–255, a second main sub-block 40 corresponding to row addresses X of 256–8K, and a dummy sub-block 50 corresponding to row addresses X of 0–255.

As illustrated in FIG. 2, when the W/Ls of the main blocks 20 and 40 are enabled in the open bit line S/A architecture, two W/Ls 12 and 22 are enabled in the same way as the folded bit line S/A architecture and thus a total of eight DQ data are outputted. In addition, in a row redundancy operation, two W/Ls of redundancy cells selected from the main blocks 20 and 40 are enabled in the same way as the conventional folded bit line technique.

However, when DQ data needs to be output using the first edge sub-blocks 10, the second edge sub-block 30 and the dummy sub-block 50, as shown in FIG. 3, three W/Ls 11, 13 and 21 (not two W/Ls) must be enabled. Therefore, the case where DQ data are outputted using the sub-blocks is different from a case where DQ data are outputted using the main blocks. Also, when row defects occur at the first edge sub-block 10, the second edge sub-block 30 and the dummy sub-block 50, a corresponding row redundancy repair operation must be processed differently from the normal operation.

Moreover, in case the dummy bit line of the memory device having the conventional open bit line architecture is processed through the straight edge block processing method, repair efficiency is degraded when a repair process is performed in a self-block.

SUMMARY OF THE INVENTION

Exemplary embodiments of the invention generally include methods for repairing semiconductor memory devices having an open bit line sense amplifier architecture, allowing possible row defects to be processed using a straight edge block when DQ data are outputted by enabling three word lines. In addition, exemplary embodiments of the invention include apparatus for repairing a semiconductor memory device having an open bit line sense amplifier architecture, allowing possible row defects to be processed using a straight edge block when DQ data are outputted by enabling three word lines.

In particular, a method for repairing a semiconductor memory device having an open bit line architecture when three word lines of a cell array block are enabled substantially at the same time, includes selecting a redundancy cell for replacing a defective memory cell coupled to one of the three word lines; determining whether to enable a word line coupled to the defective memory cell, disabling a sense amplifier coupled to the defective memory cell, determining whether to enable a word line of a memory cell corresponding to a bit line selected repeatedly due to a replacement by the redundancy cell, disabling a sense amplifier of the memory cell corresponding to the repeatedly selected bit line, and disabling the redundancy cell.

In another exemplary embodiment of the invention, an apparatus is provided for repairing a semiconductor memory device having an open bit line architecture, when three word lines of a cell array block are enabled substantially at the same time, where the cell array block includes a first block having a first edge sub-block and a first main sub-block, a second block having a second edge sub-block and a second main sub-block, and a dummy sub-block. The apparatus includes a first edge sub-block control circuit which generates a first word line control signal to disable a first word line of the first edge sub-block, and which generates a first sense amplifier control signal to disable a first sense amplifier coupled to the first word line of the first edge sub-block, based on a row address and a redundancy select signal for selecting a redundancy cell for replacing a defective memory cell. The apparatus includes a dummy sub-block control circuit which generates a second word line control signal to disable a second word line of the dummy sub-block, and which generates a second sense amplifier control signal to disable a second sense amplifier coupled to a second word line of the dummy sub-block, based on the row address and the redundancy select signal. The apparatus further includes a word line control circuit of the second edge sub-block, which generates a third word line control signal to determine if a third word line of the second edge sub-block should be enabled, and a sense amplifier control circuit of the second edge sub-block, which generates a third sense amplifier control signal to disable a third sense amplifier coupled to a first side of the third word line of the second edge sub-block, and which generates a fourth sense amplifier control signal to disable a fourth sense amplifier coupled to a second side of the third word line of the second edge sub-block.

These and other exemplary embodiments, features, aspects, and advantages of the present invention will be described and become more apparent from the following detailed description of exemplary embodiments when read in conjunction with accompanying drawings.

DETAILED DESCRIPTION OF EXEMPLARY EMBODIMENTS

In the following description of exemplary embodiments, it is to be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It is to be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Moreover, other words used to describe the relationship between elements should be interpreted in a like fashion (i.e., "between" versus "directly between", "adjacent" versus "directly adjacent", etc.).

The terminology used herein is solely for purposes of describing particular embodiments and is should not be construed as placing any undue limitation on the scope of the claimed inventions. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Figure 4:
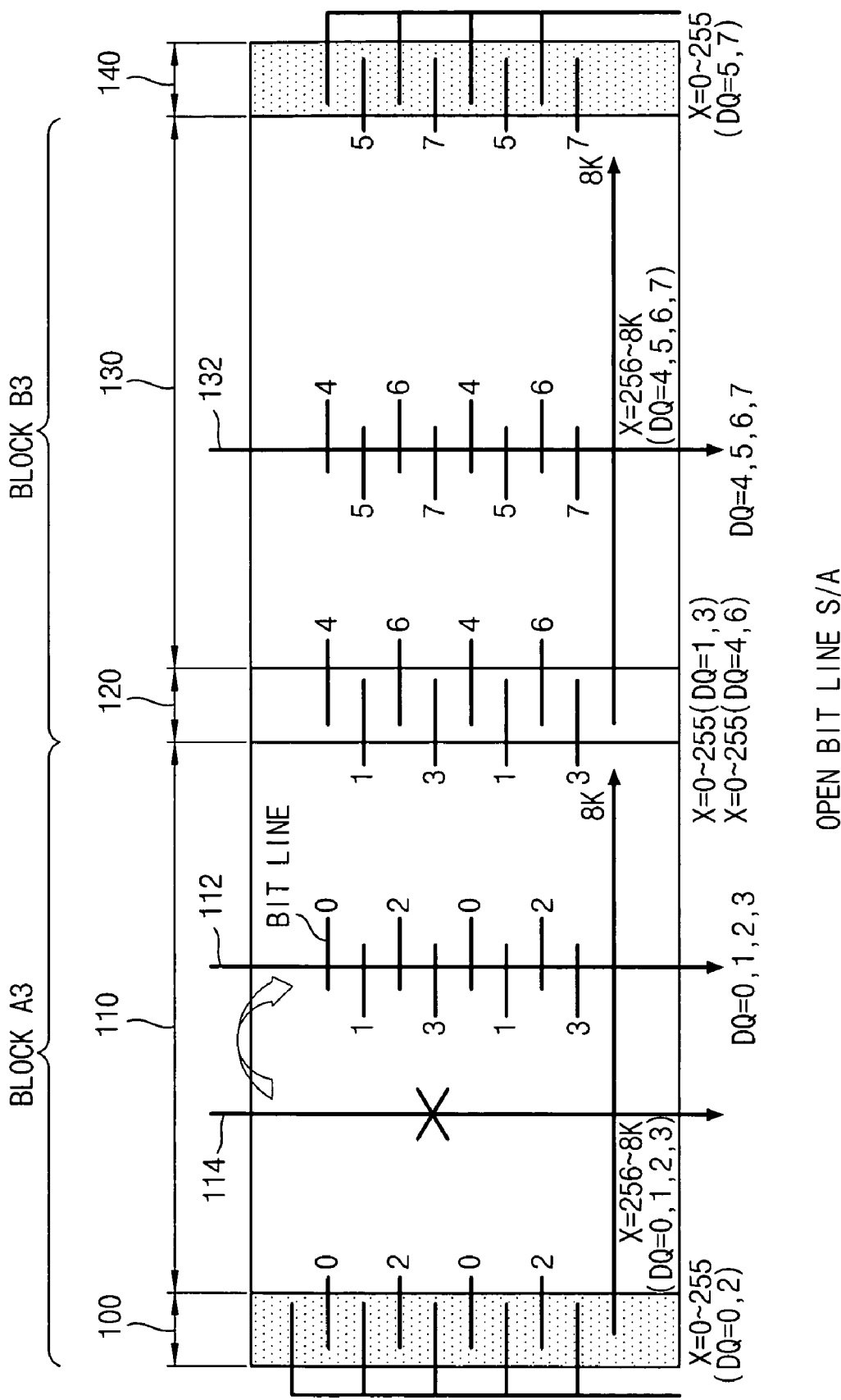
FIG. 4 schematically illustrates a row redundancy repair method according to an exemplary embodiment of the invention, when defects occur at a main block in a memory device having an open bit line sense amplifier.

Hereinafter, exemplary embodiments of the invention will be described in detail with reference to the accompanying drawings. Referring initially to FIG. 4, a conceptual diagram illustrates a row redundancy repair method for repairing defects that occur at a main block in a memory device having an open bit line sense amplifier, according to an exemplary embodiment of the invention. In FIG. 4, it is assumed that each bit line is connected to one sense amplifier (S/A) and each S/A senses data through the bit line. In the following description, it is further assumed that one cell array block (or memory bank) includes a block A3, a block B3, and a dummy sub-block, and that each block A3 and B3 includes 32 sub-blocks and has 8K word lines W/Ls.

As depicted in FIG. 4, the block A3 includes a first edge sub-block 100 (that is, a left edge block) corresponding to row addresses X of 0–255 and a first main sub-block 110 corresponding to row addresses X of 256–8K. The block B3 includes a second edge sub-block 120 (that is, a center pseudo edge block) corresponding to row addresses X of 0–255 and a second main sub-block 130 corresponding to row addresses X of 256–8K. A dummy sub-block 140 corresponds to row addresses X of 0–255. The row addresses X corresponding to the first edge sub-block 100, the second edge sub-block and the dummy sub-block 140 may have other address values within a range of 8K, such as, 0–512.

The first edge sub-block 100 is a sub-block that includes at least one first word line and is connected to an S/A disposed at the leftmost portion of the block A3, that is, an edge portion on which the block A3 and the block A4 do not border. Moreover, the second edge sub-block 120 is a sub-block including at least one second word line that is disposed at an edge portion of the block B3, on which the block B3 and the block A3 border, and is enabled by the same row address as the first edge sub-block 100.

The first main sub-block 110 is a sub-block of the block A3 excluding the first edge sub-block 100. The second main sub-block 130 is a sub-block of the block B3 excluding the second edge sub-block 120.

The dummy sub-block 140 is additionally disposed at the last edge sub-block, and is a sub-block including at least one third word line enabled by the same row address as the first edge sub-block 100. By way of example, in a ×8 mode, DQ data 0, 1, 2 and 3 of bit lines 0, 1, 2 and 3 are outputted in response to the activation of one W/L 114 within the first main sub-block 110, and DQ data 4, 5, 6 and 7 of bit lines 4, 5, 6 and 7 are outputted in response to the activation of one W/L 132 within the second main sub-block 130.

When defects occur at the first main sub-block 110 or the second main sub-block 130, a redundancy repair operation is processed in the same way as the repair process method of the memory device having the conventional folded bit line architecture.

That is, when defects (for example, defects of bit lines and/or sense amplifiers, etc) occur at a cell connected to a W/L 114 belonging to the first main sub-block 110 and an address corresponding to the defective cell is applied to the memory device, a normal path for selecting the defective cell through the W/L 114 is disconnected and a redundancy device operates to enable a bit line coupled to a W/L 112 connected to a spare cell, thereby performing a redundancy operation. In this case, when a redundancy repair operation is performed, two W/Ls 112 and 132 are enabled.

Figure 1:
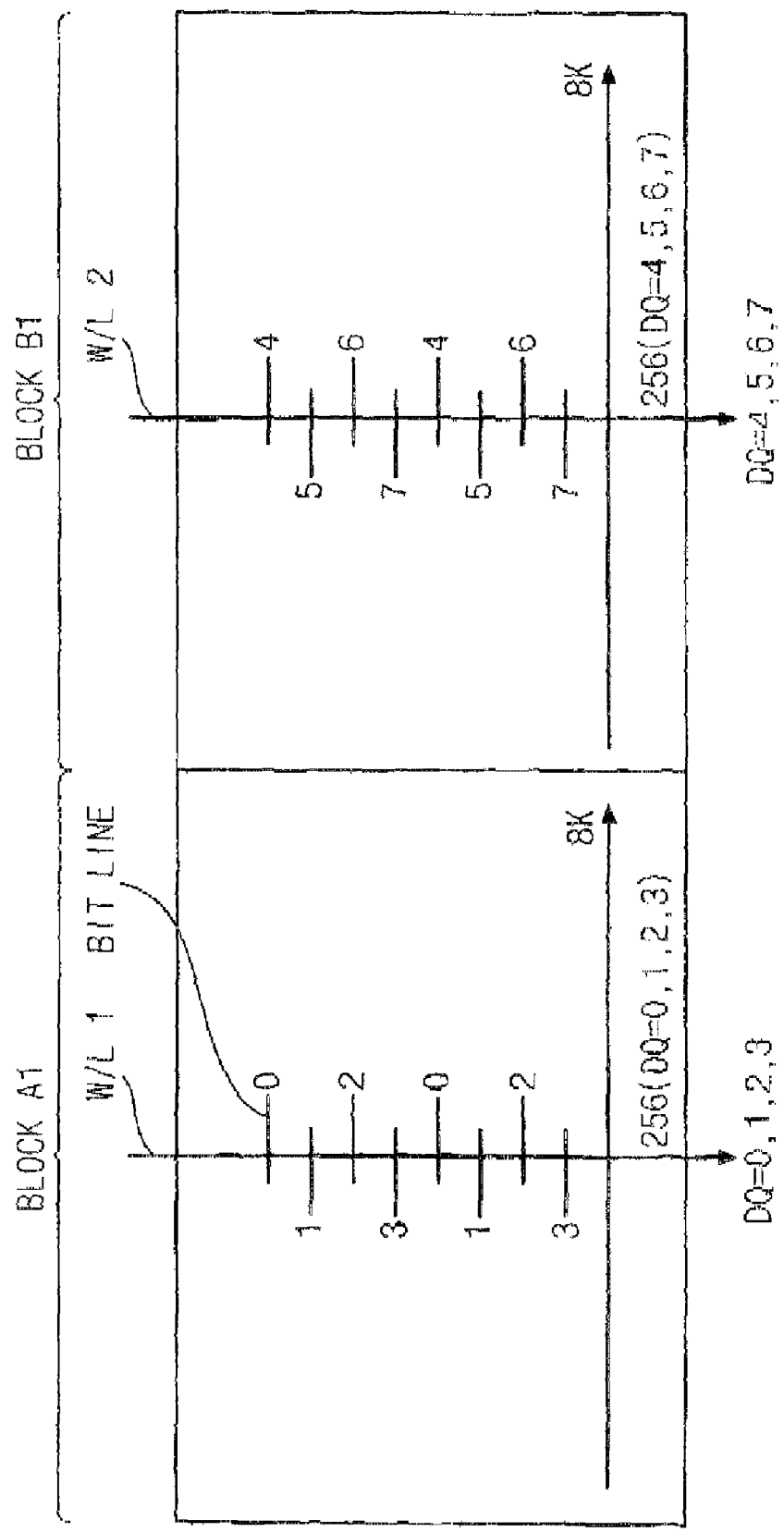
FIG. 1 is a conceptual diagram illustrating a data output operation of a conventional memory device having a folded bit line sense amplifier.
Figure 2:
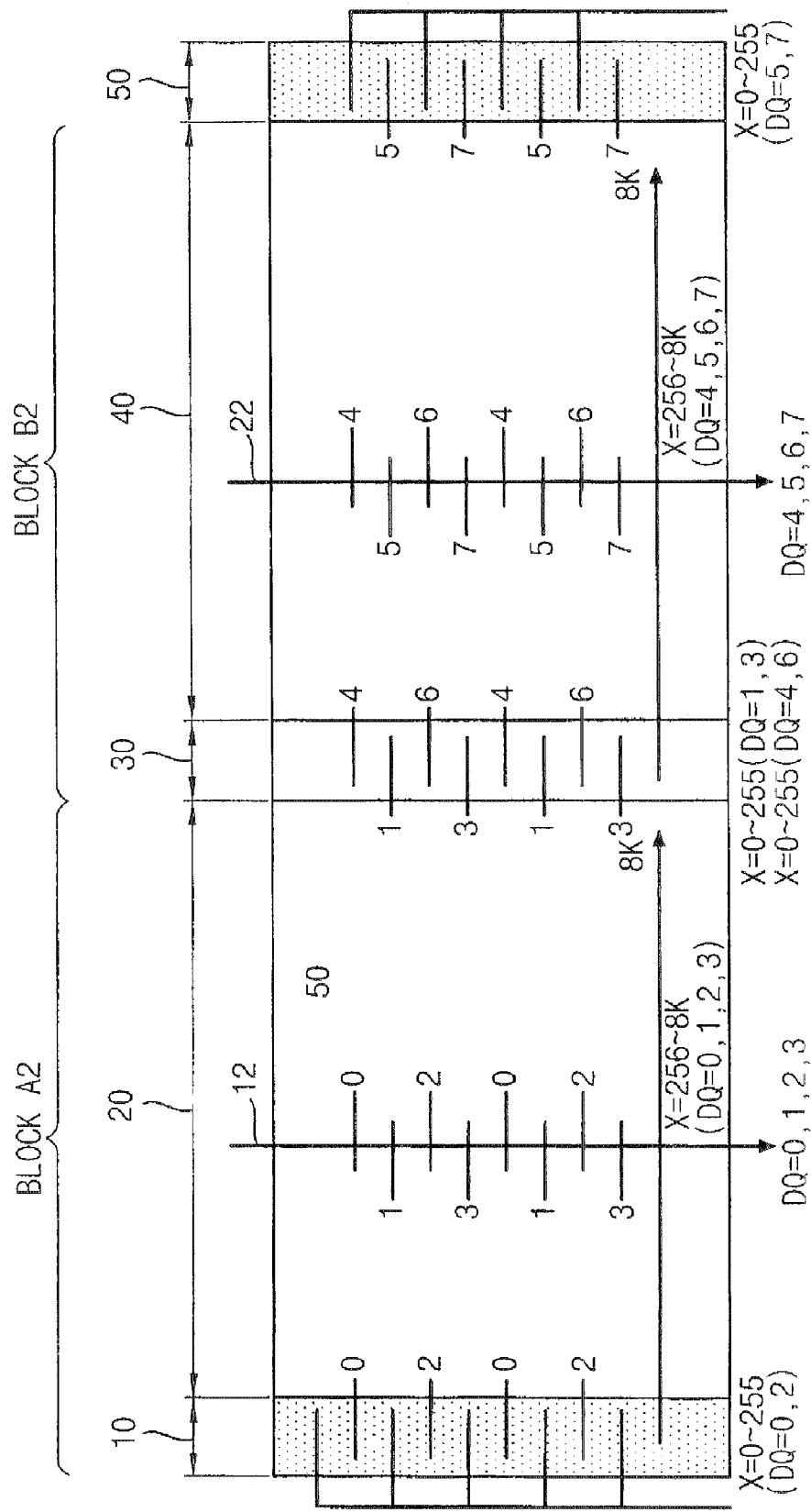
FIG. 2 schematically illustrates a method where two word lines are enabled and thus eight DQ data are outputted by a memory device having a conventional open bit line sense amplifier.
Figure 3:
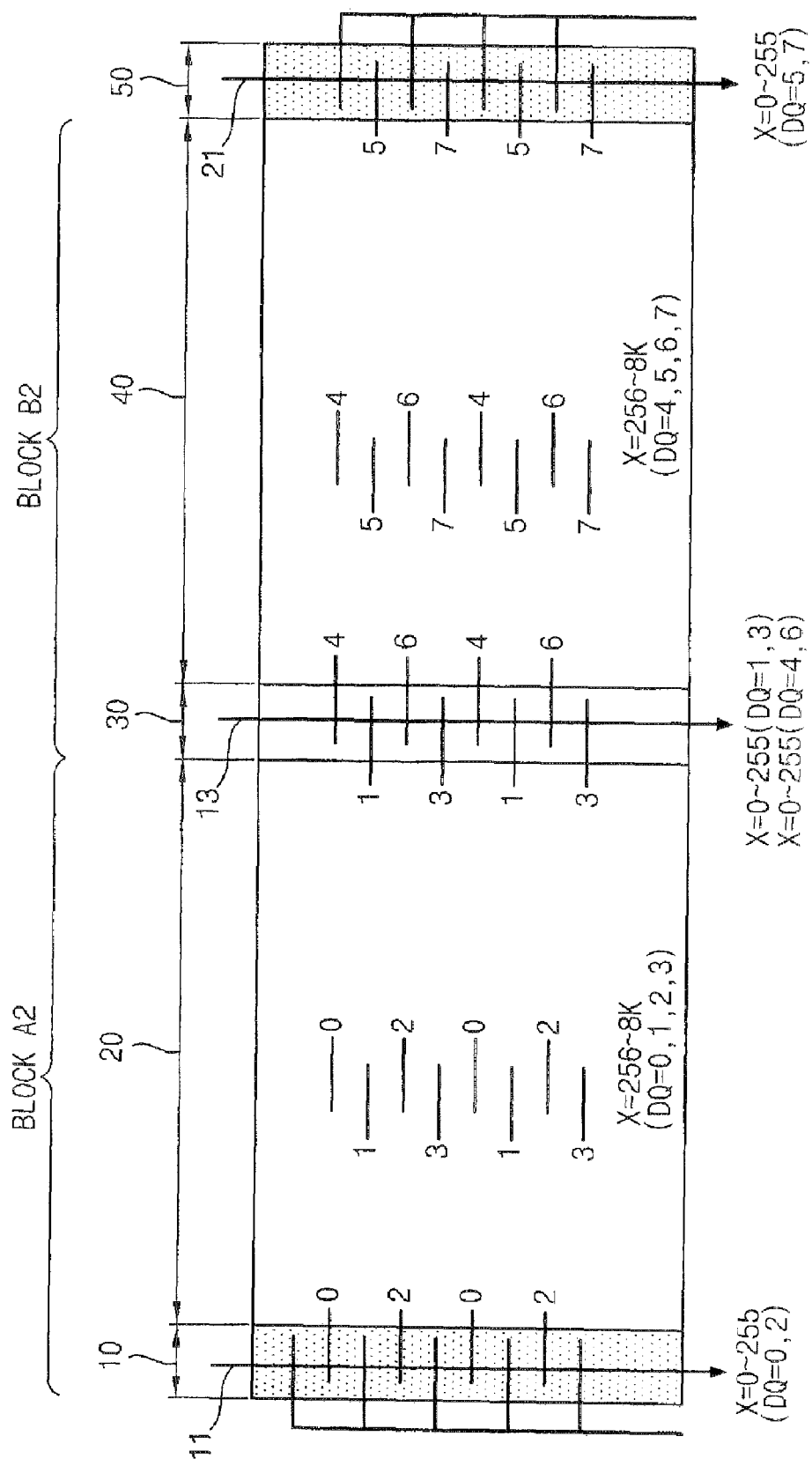
FIG. 3 schematically illustrates a method where three word lines are enabled and thus eight DQ data are outputted by a memory device having a conventional open bit line sense amplifier.

When a dummy bit line of the memory device having the open bit line S/A architecture is processed through the straight edge block method illustrated in FIGS. 2 and 3, the repair efficiency is degraded when a repair operation is performed in a self-block, i.e. a block having the defective cell. Accordingly, by performing the repair operation in a block(s) other than the block having the defective cell, it is possible to obtain the same repair efficiency as repair efficiency of a case where defects occur at the main sub-blocks 110 and 130.

In accordance with exemplary embodiments of the invention, methods for performing a row redundancy repair operation in blocks other than the block having the defective cell when row defects occur at the first edge sub-block 100, the second edge sub-block 120, and/or the dummy sub-block 140 can be broadly classified based on the defect condition as follows: (1) where defects occur at the first edge sub-block 100 or the dummy sub-block 140; (2) where defects occur at a data path of data outputted from the second edge sub-block 120 through one of S/A coupled to the second edge sub-block 120, or; (3) where defects occur at both data paths of data outputted from the second edge sub-block 120 through both of S/As coupled to the second edge sub-block 120, each of which will be described in detail below.

Figure 5:
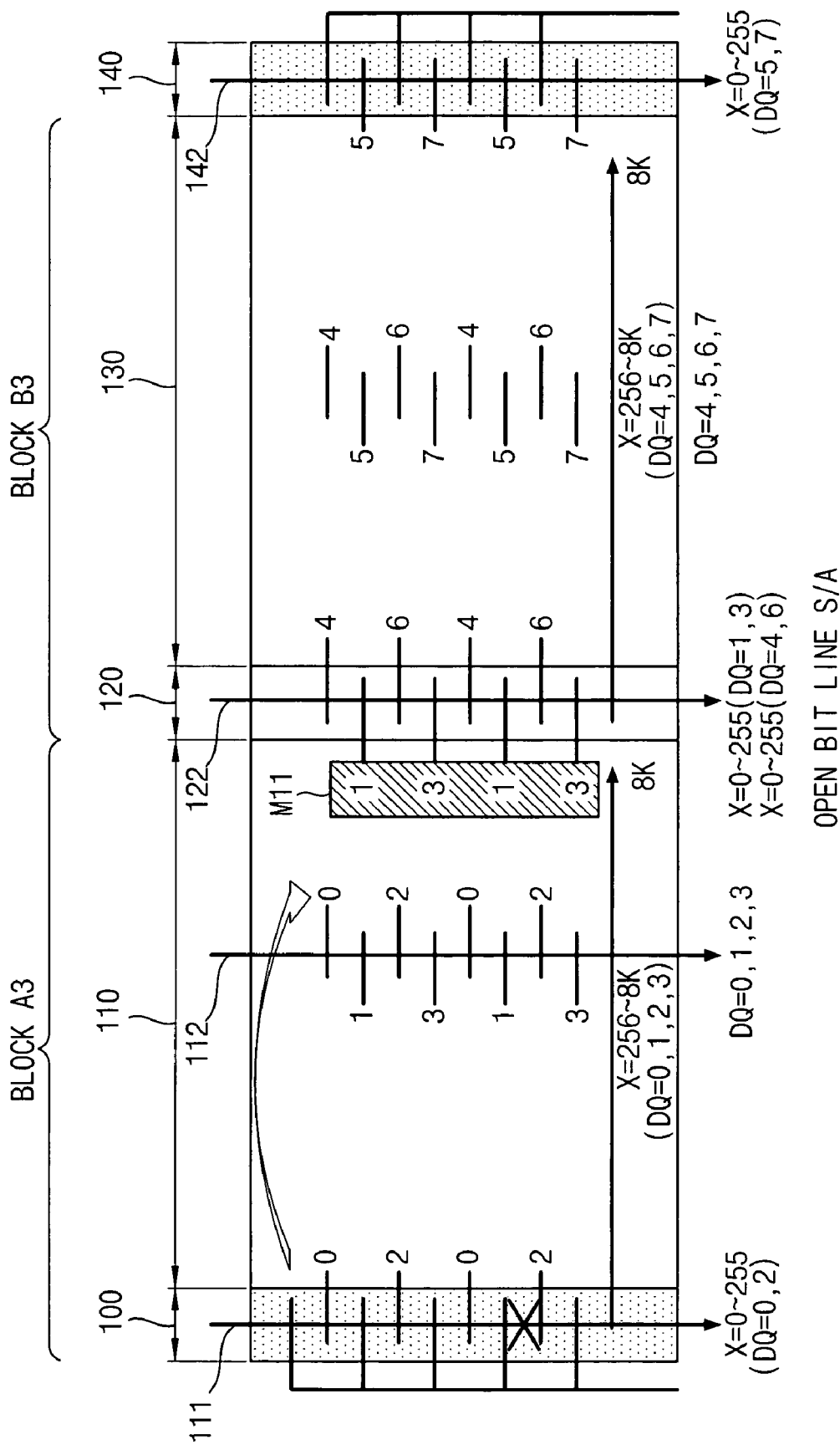
FIG. 5 schematically illustrates a row redundancy repair method according to an exemplary embodiment of the invention, when defects occur at a first edge sub-block in a memory device having an open bit line sense amplifier.

For example, FIG. 5 schematically illustrates a method for performing a row redundancy repair operation according to an exemplary embodiment of the invention. In particular, FIG. 5 schematically illustrates a row redundancy repair operation in a memory device having an open bit line sense amplifier where defects occur at a first edge sub-block (e.g., the above listed defect condition (1) where defects occur at the first edge sub-block 100. For purposes of illustration, assume that in ×8 mode, DQ data 0 and 2 of bit lines 0 and 2 are outputted in response to the activation of a W/L 111 within the first edge sub-block 100, DQ data 1 and 3 are outputted through a left S/A (not shown) connected to left bit lines (M11, bit lines 1 and 3) in response to the activation of a W/L 122 within the second edge sub-block 120, DQ data 4 and 6 are outputted through a right S/A (not shown) connected to right bit lines (bit lines 4 and 6) in response to the activation of a W/L 122, and DQ data 5 and 7 are outputted in response to the activation of a W/L 142 of the dummy sub-block 140. Consequently, a total of eight DQ data 0, 1, 2, 3, 4, 5, 6 and 7 are outputted.

Referring to FIG. 5, a repair operation is performed using a row redundancy cell connected to the W/L 112 of the first main sub-block 110 that is different from the first edge sub-block 100 when defects occur at the first edge sub-block 100, thereby replacing defective DQ data 0 and 2 of the first edge sub-block 100 with DQ data 0 and 2 of the spare cell the first main sub-block 110. At this point, the DQ data 1 and 3 are simultaneously repaired by the W/L 112 together with the DQ data 0 and 2. Consequently, four DQ data 0, 1, 2 and 3 are outputted. Among four DQ data 4, 5, 6 and 7 of the block B3, the DQ data 5 and 7 are outputted from the dummy sub-block 140 and the DQ data 4 and 6 are outputted from the second edge sub-block 120. The DQ data 1 and 3 of the second edge sub-block need to be blocked because the DQ data 1 and 3 are already outputted in response to the activation of a W/L 112. Namely, the DQ data 1 and 3 of the second edge sub-block need to be prevented from being outputted from the second edge sub-block 120.

Therefore, a defective word line 111 of the first edge sub-block 100 is disabled, and an equalizer (not shown) and a left S/A (not shown) of the second edge sub-block 120 are disabled to inactivate a corresponding bit line M11, thereby blocking the DQ data 1 and 3 (as will be described in further detail below).

Figure 6:
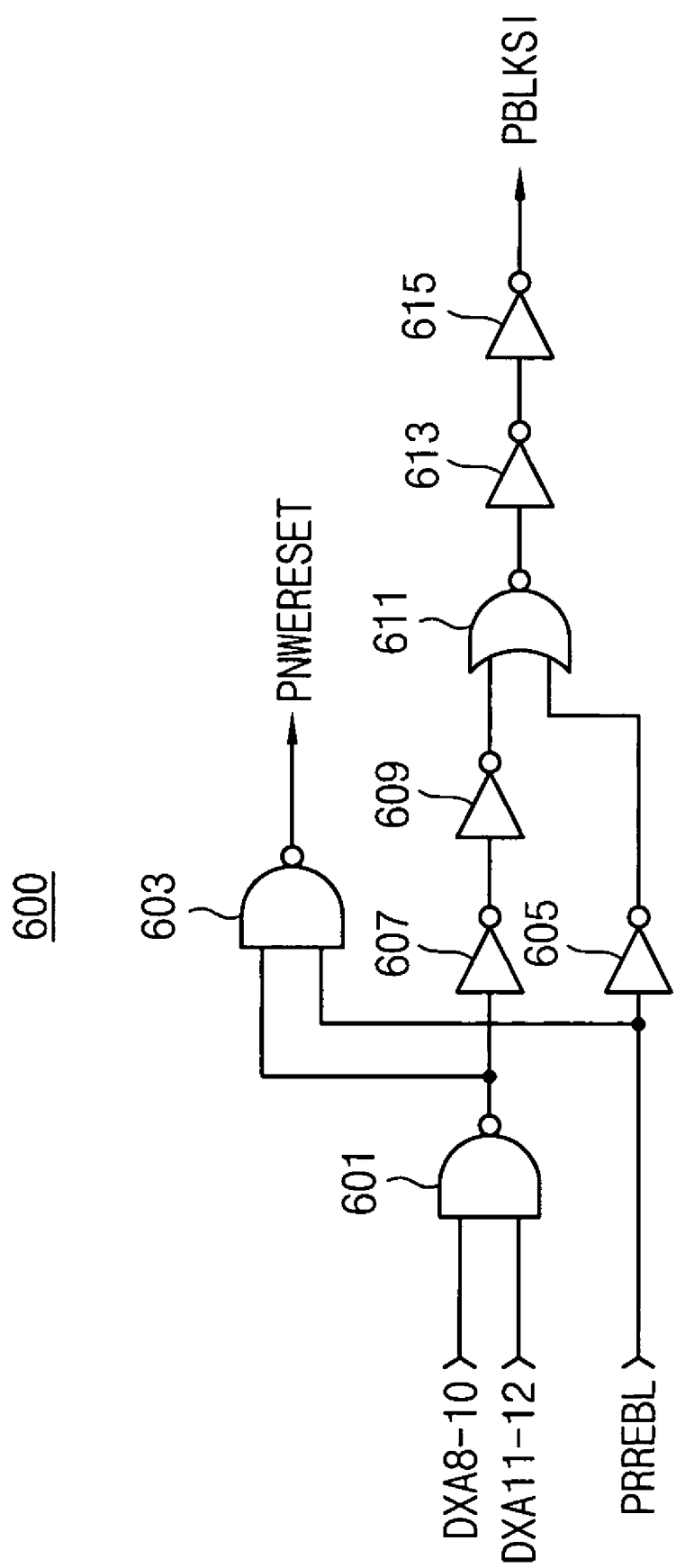
FIG. 6 is a circuit diagram of a first edge sub-block control circuit for controlling the first edge sub-block in FIG. 5 according to an exemplary embodiment of the present invention.

Each block A3 and B3 includes a block control circuit at every 32 sub-blocks, which will now be described with reference to the exemplary embodiments of FIGS. 6, 7 and 8. In particular, FIG. 6 is a circuit diagram of a first edge sub-block control circuit for controlling the first edge sub-block in FIG. 5 according to an exemplary embodiment of the present invention. In FIG. 6., a first edge sub-block control circuit 600 includes a plurality of NAND gates 601 and 603, a plurality of inverters 605, 607, 609, 613 and 615, and a NOR gate 611, having input and output connections as depicted.

When a defective memory cell is selected by a row address in the first edge sub-block 100, a redundancy select signal for selecting a redundancy cell of the first main sub-block 110 is generated for replacing the defective memory cell. For example, the redundancy select signal may be a low-level fuse state signal PRREBL generated when a fuse of the redundancy cell is cut. A word line W/L 112 corresponding to a redundancy cell of the first main sub-block 110 is enabled based on a fuse state signal PRREBL.

The first edge sub-block control circuit 600 receives bits DXA8, 9 and 10 and DXA11 and 12 of a row address and the fuse state signal PRREBL, and generates a word line control signal PNWERESET for disabling a word line of the defective first edge sub-block 100 and an S/A control signal (or block select signal) PBLKSI for disabling an equalizer and an S/A of a corresponding block, i.e., the first edge sub-block 100. The bits DXA8–10 and DXA11–12 contain block information for selecting one of the 32 sub-blocks.

The NAND gate 603 outputs a logic level 'HIGH' according to the fuse state signal PRREBL of a logic level 'LOW' generated from the redundancy cell having a cut fuse, and thus the word line control signal PNWERESET becomes a logic level 'HIGH', thereby disabling a W/L of the defective first edge sub-block 100. Further, the fuse state signal PRREBL of a logic level 'LOW' causes the NOR gate 611 to output a logic level 'LOW', and thus the signal PBLKSI becomes a logic level 'LOW', thereby disabling an equalizer and an S/A of the defective first edge sub-block 100.

Figure 7:
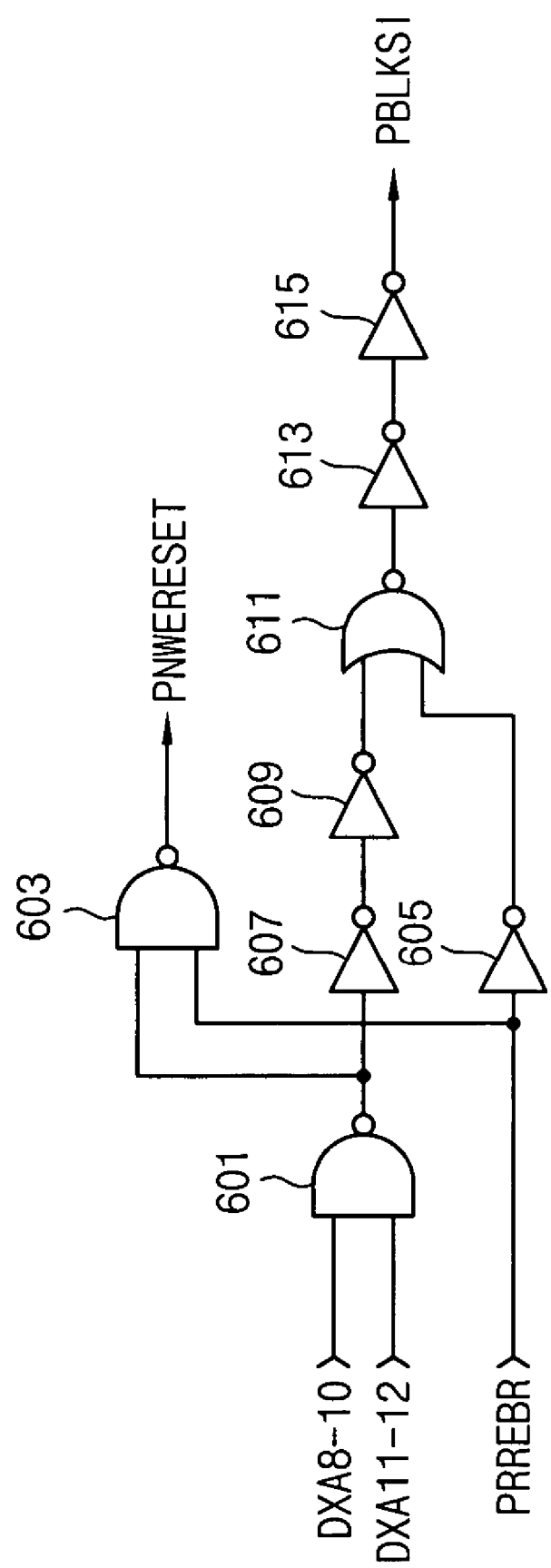
FIG. 7 is a circuit diagram of a dummy sub-block control circuit for controlling a dummy sub-block in FIG. 5, according to an exemplary embodiment of the present invention.

FIG. 7 is a circuit diagram of a dummy sub-block control circuit for controlling a dummy sub-block in FIG. 5 according to an exemplary embodiment of the present invention. Referring to FIG. 7, when defects occur at a memory cell of the dummy sub-block 140, the defective memory cell is repaired by a redundancy cell of the second main sub-block 130. In this case, when a fuse corresponding to the redundancy cell of the second main sub-block 130 is cut, a fuse state signal PRREBR of a logic level 'LOW' is generated, thereby disabling a W/L 132 corresponding to the redundancy cell of the second main sub-block 130 (see FIG. 13).

The circuit 700 of FIG. 7 is similar to the circuit 600 of FIG. 6 except that a fuse state signal PRREBR is inputted instead of the fuse state signal PRREBL. Consequently, a dummy sub-block control circuit 700 generates a word line control signal PNWERESET for disabling a word line of a defective dummy sub-block 140 and an S/A control signal PBLKSI for disabling an equalizer and an S/A of a corresponding block, i.e., the dummy sub-block 140.

Figure 8:
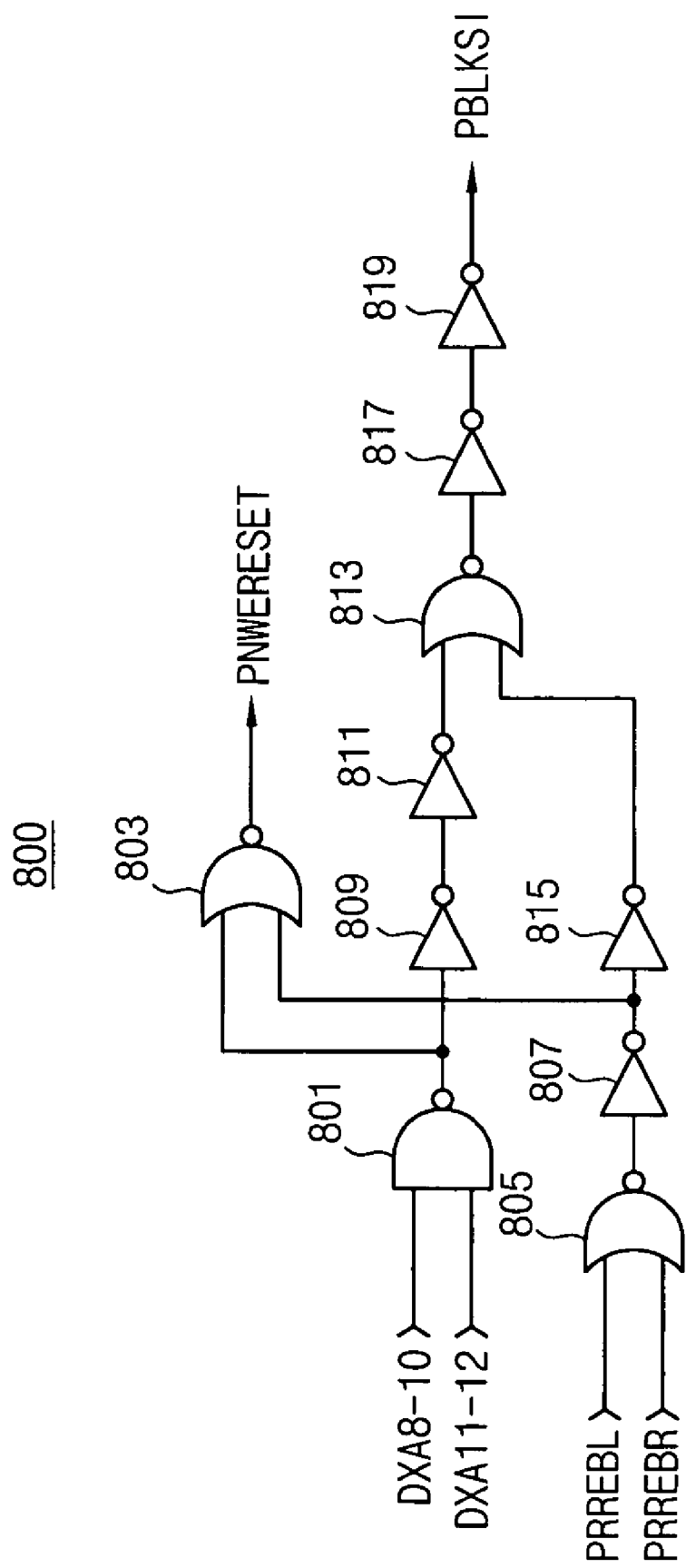
FIG. 8 is a circuit diagram of a second edge sub-block control circuit for controlling a second edge sub-block in FIG. 5, according to an exemplary embodiment of the present invention.

FIG. 8 is a circuit diagram of a second edge sub-block control circuit for controlling a second edge sub-block in FIG. 5 according to an exemplary embodiment of the present invention. Referring to FIG. 8, a second edge sub-block control circuit 800 includes a plurality of NAND gates 801 and 803, a plurality of inverters 807, 809, 811, 815, 817 and 819, and NOR gates 805 and 813, having input and output connections as shown. When row defects occur at the second edge sub-block 120 and thus a fuse corresponding to a row redundancy cell of the first main sub-block 110 is cut, a fuse state signal PRREBL of a logic level 'LOW' is generated, thereby disabling a W/L 112 corresponding to a redundancy cell of the first main sub-block 110. Further, when row defects occur at the second edge sub-block 120 and thus a fuse corresponding to a row redundancy cell of the second main sub-block 130 is cut, a fuse state signal PRREBR of a logic level 'LOW' is generated, thereby disabling a W/L corresponding to a redundancy cell of the second main sub-block 130. When a fuse corresponding to the row redundancy cell of the first or second main sub-block 110 or 130 is not cut, a fuse state signal PRREBL of a logic level 'HIGH' or PRREBR of a logic level 'HIGH' is generated.

The second edge sub-block control circuit 800 receives bits DXA8–10 and DXA11–12 of a row address and the fuse state signals PRREBL and PRREBR, and thus generates a word line control signal PNWERESET for disabling a word line of a defective second edge sub-block 120 and an S/A control signal (or block select signal) PBLKSI for disabling an equalizer and an S/A of a corresponding block, that is, the second edge sub-block 120.

When defects occur at both S/As of the second edge sub-block 120, the NOR gate 803 outputs a logic level 'HIGH' according to the fuse state signals PRREBL of a logic level 'LOW' and PRREBR of a logic level 'LOW' generated from the redundancy cell having a cut fuse and thus the word line control signal PNWERESET becomes a logic level 'HIGH', thereby disabling a W/L of the defective second edge sub-block 120. On the contrary, when defects occur at one S/A of the second edge sub-block 120, the NOR gate 803 outputs a logic level 'LOW' according to a low fuse state signal PRREBL and a high fuse state signal PRREBR (or a high fuse state signal PRREBL and a low fuse state signal PRREBR) and thus the word line control signal PNWERESET becomes a logic level 'LOW', thereby enabling a W/L of the defective second edge sub-block 120. Also, the fuse state signals PRREBL and PRREBR of a logic level 'LOW' cause the NOR gate 813 to output a logic level 'LOW', and thus the signal PBLKSI becomes a logic level 'LOW', thereby disabling an equalizer and an S/A of the defective second edge sub-block 100.

Figure 9:
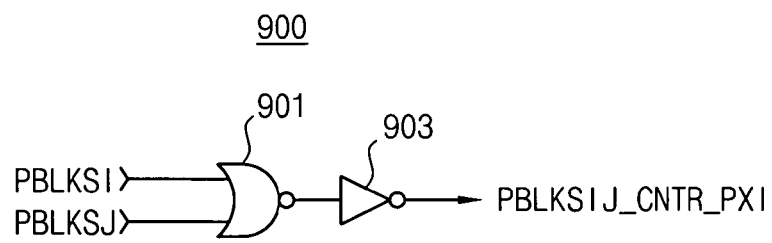
FIG. 9 is a circuit diagram of a second edge sub-block word line control circuit for controlling selection of a word line of the second edge sub-block in FIG. 5, according to an exemplary embodiment of the present invention.

FIG. 9 is a circuit diagram of a second edge sub-block word line control circuit for controlling selection of a word line of the second edge sub-block in FIG. 5 according to an exemplary embodiment of the present invention. Referring to FIG. 9, a word line control circuit 900 of the second edge sub-block 120 includes a NOR gate 901 and an inverter 903 connected as shown. When the signal PRREBL is a logic level 'LOW' and the signal PRREBR is a logic level 'HIGH', the PBLKSI (in FIG. 8) becomes a logic level 'HIGH' and thus a W/L select signal PBLKSIJ_CNTR_PXI outputted from the NOR gate 901 becomes a logic level 'HIGH', thereby enabling a W/L 122 of the second edge sub-block 120. In contrast, when defects occur at the both S/As of the second edge sub-block 120 and thus the redundancy cells of the first and second main sub-blocks 110 and 130 are all used, the signals PBLKSI and PBLKSJ become a logic level 'LOW' and the signal PGLKSIJ_CNTR_PXI becomes a logic level 'LOW', thereby disabling the W/L 122 of the second edge sub-block 120.

Figure 10:
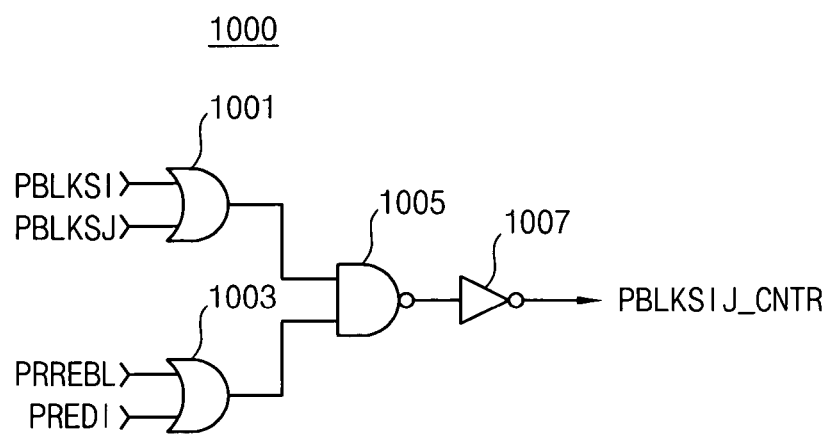
FIG. 10 is a circuit diagram of a second edge sub-block sense amplifier control circuit for controlling a left sense amplifier of the second edge sub-block in FIG. 5, according to an exemplary embodiment of the present invention.

FIG. 10 is a circuit diagram of a second edge sub-block sense amplifier control circuit for controlling a left sense amplifier of the second edge sub-block in FIG. 5 according to an exemplary embodiment of the present invention. Referring to FIG. 10, an S/A control circuit 1000 for controlling a left S/A of the second edge sub-block 120 includes OR gates 1001 and 1003, a NAND gate 1005, and an inverter 1007, connected as shown. The S/A control circuit 1000 receives a signal PBLKSI, a signal PBLKSJ, and a PREDI signal, and a PRREBL signal generated from the redundancy cell of the first main sub-block 110 when defects occur at the left S/A of the second edge sub-block 120, and thus generates an S/A control signal PBLKSIJ_CNTR for enabling or disabling an equalizer and the left S/A of the second edge sub-block 120. The PREDI signal serves to prevent a redundancy cell from being used by left and right neighboring sub-blocks of the second edge sub-block 120. For example, the PREDI signal of a logic level 'LOW' indicates that the redundancy cell is not used by the left and right neighboring sub-blocks of the second edge sub-block 120.

Figure 11:
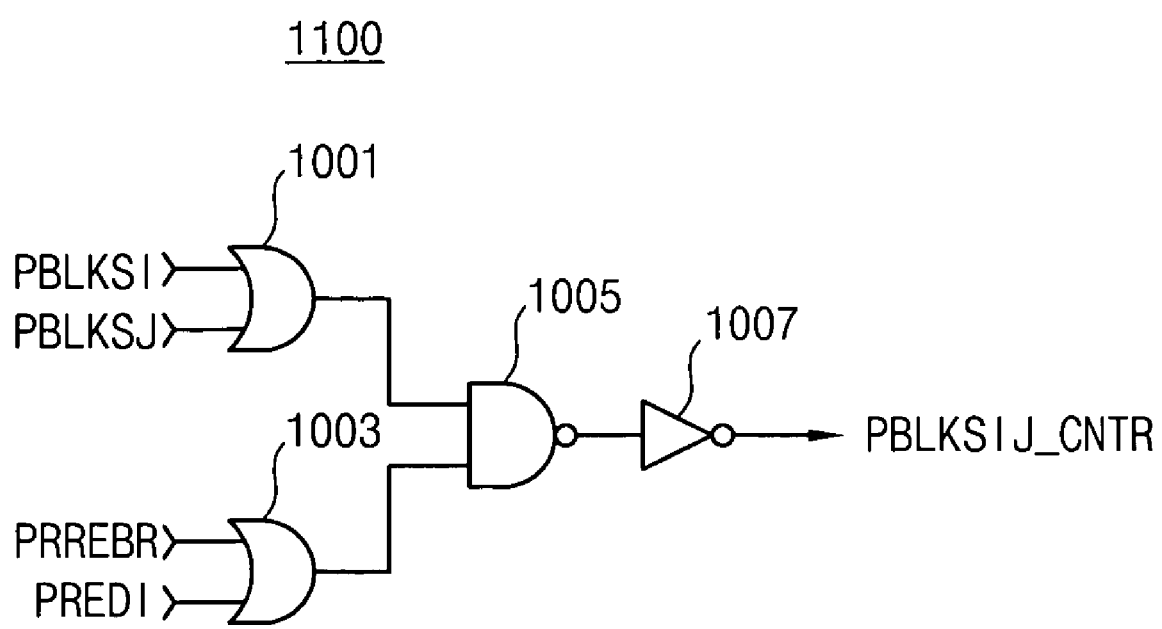
FIG. 11 is a circuit diagram of a second edge sub-block sense amplifier control circuit for controlling a right sense amplifier of the second edge sub-block in FIG. 5, according to an exemplary embodiment of the present invention.

FIG. 11 is a circuit diagram of a second edge sub-block sense amplifier control circuit for controlling a right sense amplifier of the second edge sub-block in FIG. 5 according to an exemplary embodiment of the present invention. In FIG. 11, an S/A control circuit 1100 is structurally and functionally similar to the S/A control circuit 1000 with the exception that it receives the PRREBR signal instead of the PRREBL signal.

Figure 12:
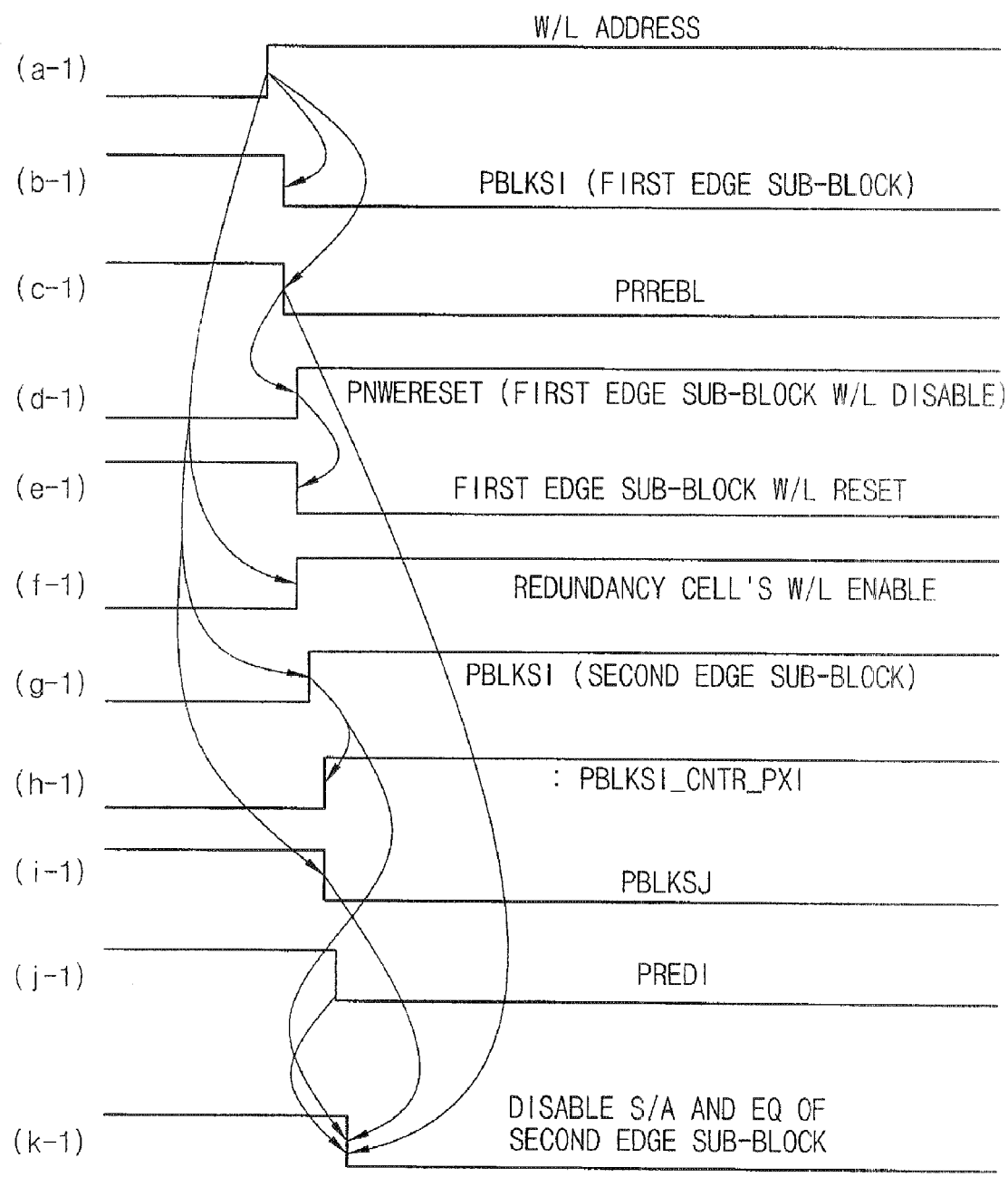
FIG. 12 is a timing diagram that illustrates a row redundancy repair method according to an exemplary embodiment of the invention, when defects occur at the first edge sub-block in FIG. 5.

FIG. 12 is a timing diagram illustrating a row redundancy repair process according to an exemplary embodiment of the invention where defects occur at the first edge sub-block in FIG. 5. An exemplary repair method depicted in FIG. 12 will be described with reference to FIGS. 5, 6, and 8-10. In the following description, it is assumed that a W/L address is inputted to a sub-block control circuit installed at each sub-block of the memory device and, e.g., the signals DXA8–10 and 11–12 in FIG. 6 among W/L addresses are inputted to the first edge sub-block control circuit 600 connected to the first edge sub-block 100 (a-1).

The signal PRREBL of a logic level 'LOW' is generated by cutting a fuse of the redundancy cell of the first main sub-block 110 (c-1). Referring to FIG. 6, the signals DXA8–10 and 11–12 are inputted to the NAND gate 601, the NAND gate 601 outputs a logic level 'LOW', the inverter 605 receives the signal PRREBL of a logic level 'LOW' to output a logic level 'HIGH', and the signal PBLKSI of a logic level 'LOW' is outputted to the first edge sub-block 100 (b-1). Accordingly, the signal PBLKSI of a logic level 'LOW' is outputted to disable an equalizer and an S/A of the first edge sub-block 100. A W/L of the redundancy cell is enabled (f-1). By the first edge sub-block control circuit 600, the signal PNWERESET becomes a logic level 'HIGH' (d-1). Consequently, a W/L of a defective first edge sub-block 100 is disabled (e-1). Since the signal PRREBL has a logic level 'LOW' and fuse cutting due to a redundancy cell does not occur at the second main sub-block 130, the signal PRREBR has a logic level 'HIGH'.

Referring to FIG. 8, the signals DXA8–10 and 11–12 are inputted to the NAND gate 801, the NAND gate 801 outputs a logic level 'LOW', the NOR gate 805 receives the signal PRREBL of a logic level 'LOW' and the signal PRREBR of a logic level 'HIGH' to output a logic level 'LOW', and the signal PBLKSI of a logic level 'HIGH'is outputted to the second edge sub-block 120 (g-1).

Referring to FIG. 9, the NOR gate 901 receives the signal PBLKSI of a logic level 'HIGH' and the signal PBLKSJ of a logic level 'LOW' to output a logic level 'LOW' (i-1), and the signal PBLKSIJ_CNTR_PXI becomes a logic level 'HIGH' (h-1). Consequently, a W/L of the second edge sub-block 120 is enabled.

Referring to FIG. 10, the OR gate 1003 receives the signal PRREBL of a logic level 'LOW' and the signal PREDI of a logic level 'HIGH' to output a logic level 'HIGH'. The OR gate 1001 receives the signal PBLKSI of a logic level 'HIGH' and the signal PBLKSJ of a logic level 'LOW' to output a logic level 'HIGH'. The NAND gate 1005 outputs a logic level 'LOW'. Consequently, the signal PBLKSIJ_CNTR becomes a logic level 'HIGH'. Accordingly, an equalizer and a left S/A of the second edge sub-block 100 are disabled (k-1).

Consequently, the row redundancy repair method for a case where defects occur at the first edge sub-block 100 disables the equalizer and the left S/A of the second edge sub-block 120 while enabling the W/L of the second edge sub-block 120, so as to block the DQ data 1 and 3 overlapped due to the redundancy cell.

Figure 13:
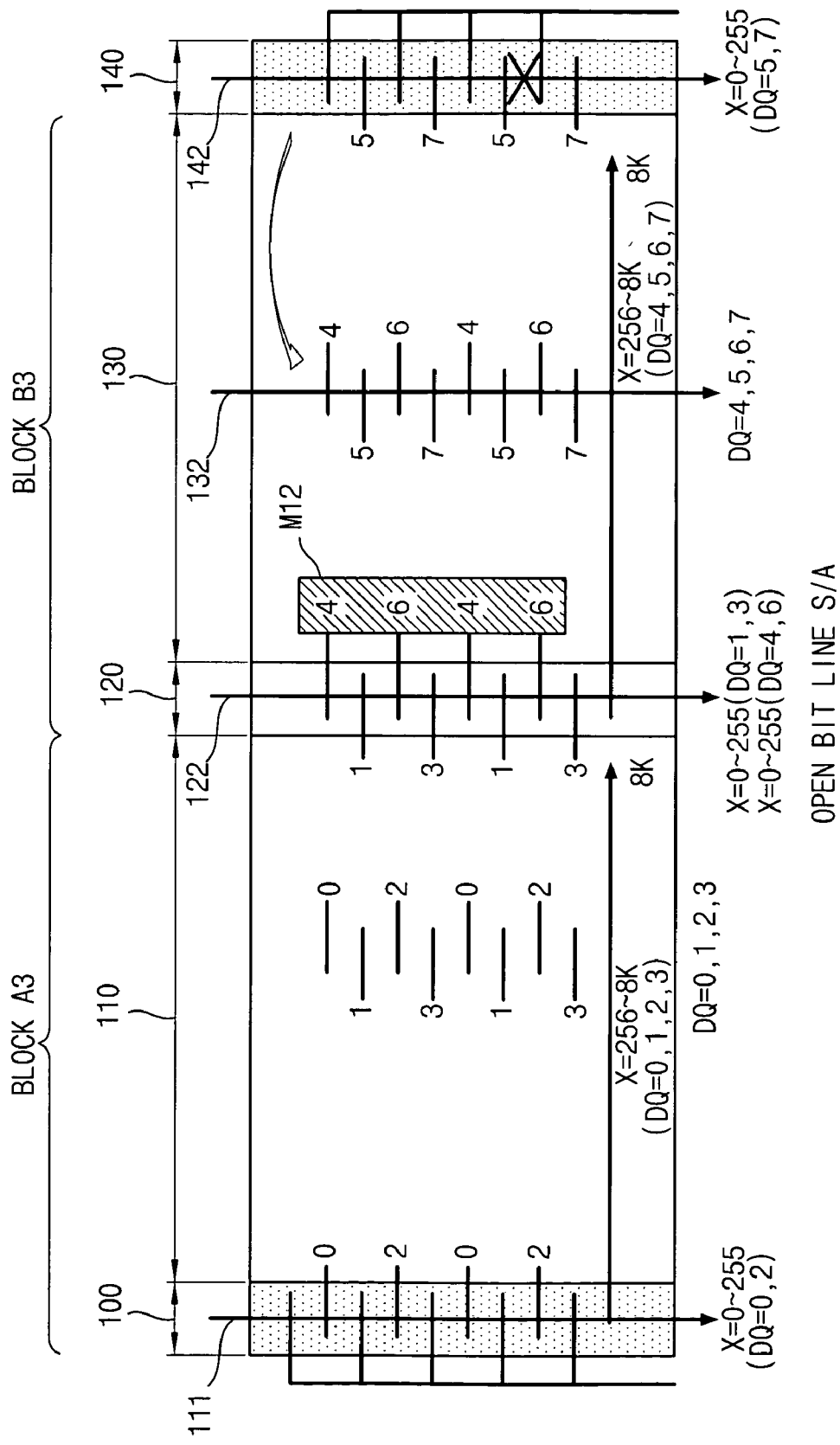
FIG. 13 schematically illustrates a row redundancy repair method according to an exemplary embodiment of the invention, when defects occur at a dummy sub-block in a memory device having an open bit line sense amplifier.

FIG. 13 schematically illustrates a method for performing a row redundancy repair operation according to an exemplary embodiment of the invention. In particular, FIG. 13 schematically illustrates a row redundancy repair operation in a memory device having an open bit line sense amplifier where defects occur at a dummy sub-block (e.g., the above listed defect condition (1)). Referring to FIG. 13, because defects occur at the dummy sub-block 140 instead of the first edge sub-block 100, the W/L 132 of the redundancy cell in the second main sub-block 130, the W/L 111 in the first edge sub-block 100, and the W/L 122 in the second edge sub-block 120 are enabled, and thus eight DQ data are outputted. In this case, in order to block the DQ data 4 and 6 overlapped due to the activation of the W/L 132, the DQ data 4 and 6 of the second edge sub-block 120 are blocked.

The dummy sub-block control circuit 700 is connected to the dummy sub-block 140, and the operation of the S/A of the second edge sub-block 120 is performed using the right S/A control circuit 1100 of the second edge sub-block in FIG. 11. In this case, because the signal PRREBR has a logic level 'LOW', the signal PBLKSI in FIG. 7 has a logic level 'HIGH' and the signal PNWERESET has a logic level 'HIGH'. Consequently, a W/L of a defective dummy sub-bock 140 is disabled.

In FIG. 9, because the signal PBLKSI has a logic level 'HIGH', the signal PBLKSIJ_CNTR_PXI becomes a logic level 'HIGH'. Consequently, a W/L of the second edge sub-block 120 is enabled. Also, referring to FIG. 11, because the signals PRREBR and PREDI have a logic level 'LOW' and the signal PBLKSI has a logic level 'HIGH', the signal PBLKSIJ_CNTR becomes a logic level 'LOW'. Accordingly, the equalizer and the right S/A of the second edge sub-block 100 are disabled.

Figure 14:
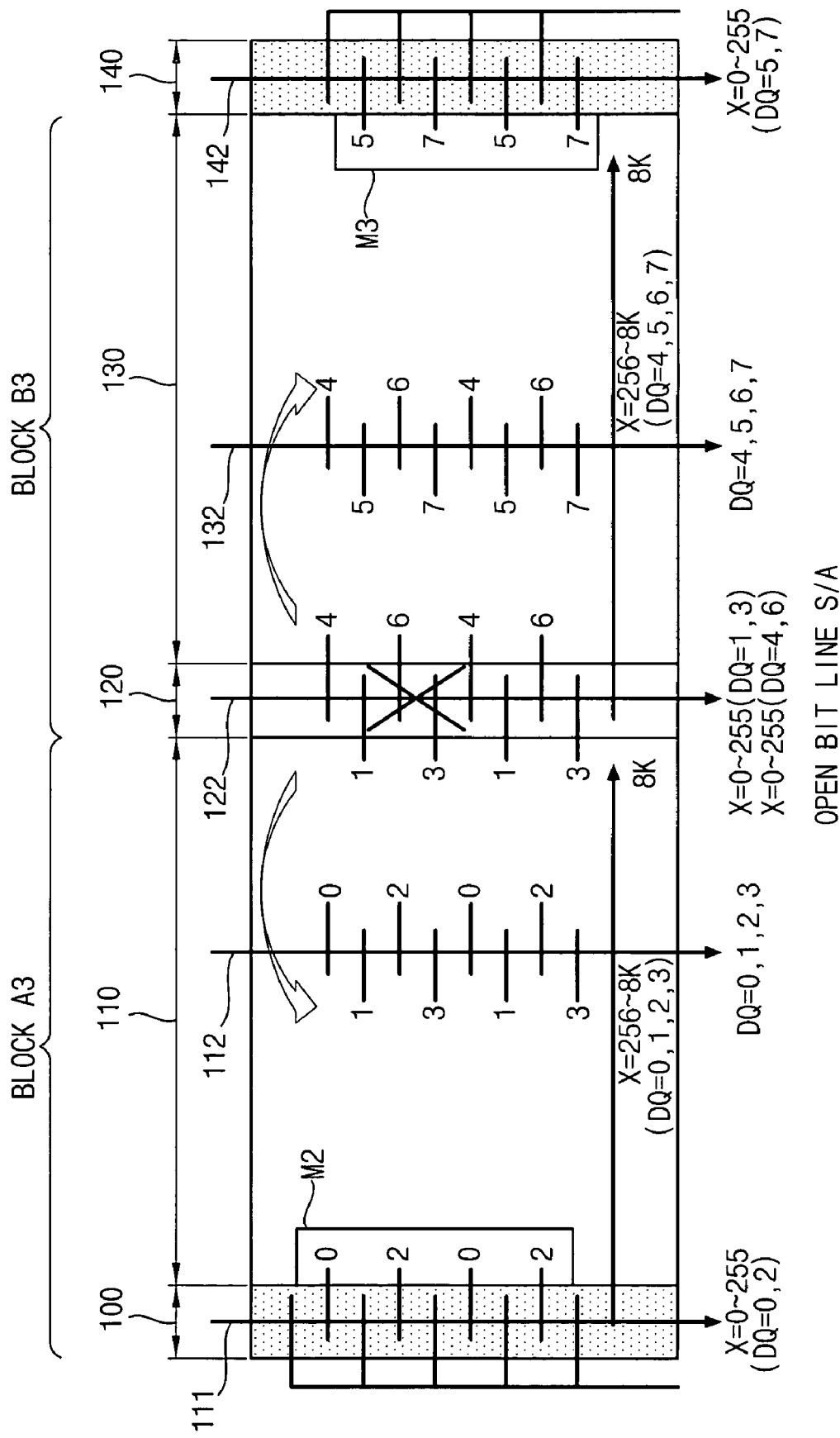
FIG. 14 schematically illustrates a row redundancy repair method according to an exemplary embodiment of the invention, when defects occur at both sense amplifiers of a second edge sub-block in a memory device having an open bit line sense amplifier.
Figure 15:
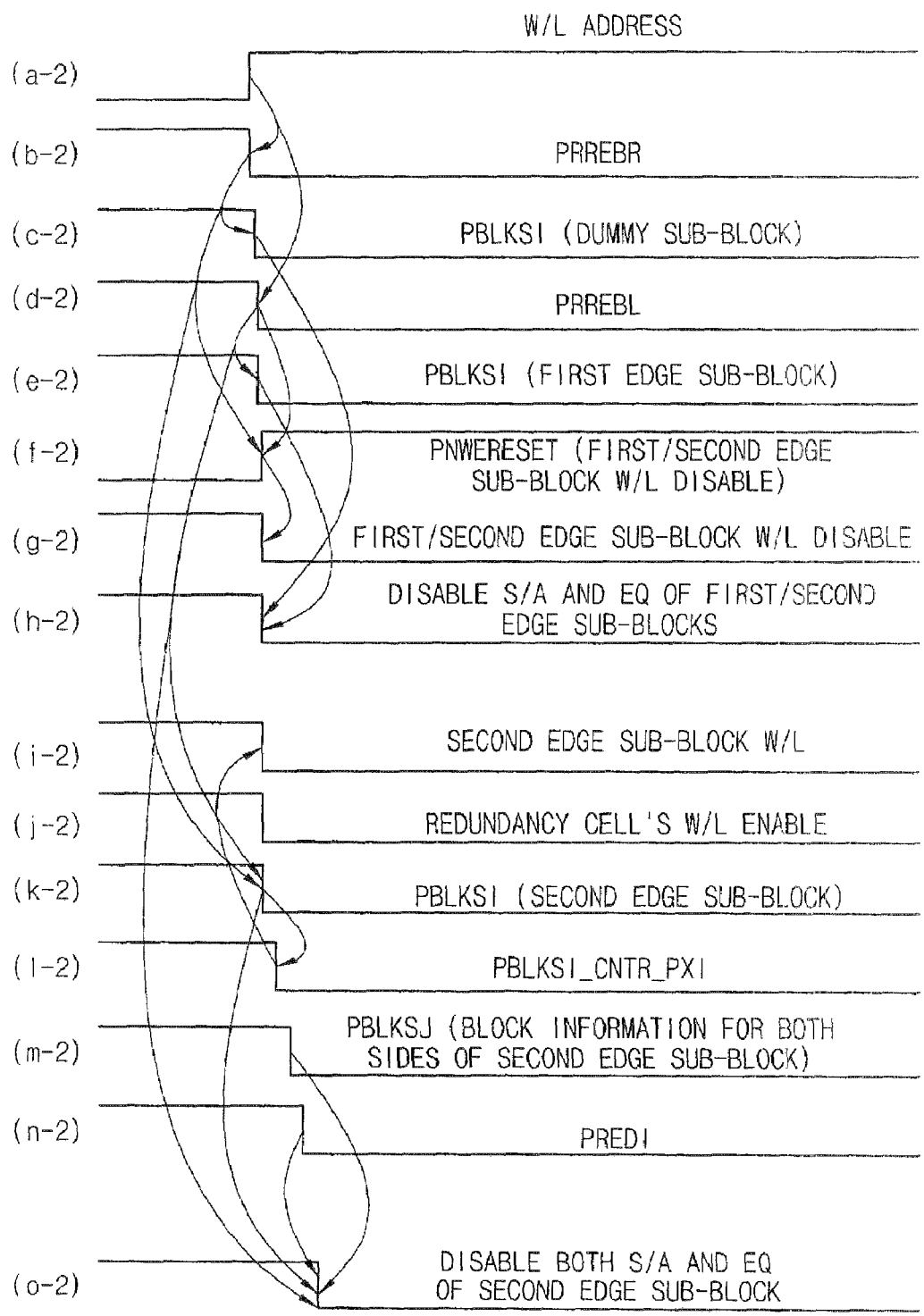
FIG. 15 is a timing diagram that illustrates a row redundancy repair process according to an exemplary embodiment of the invention, when defects occur at both sense amplifiers of the second edge sub-block in FIG. 14.

FIG. 14 is a conceptual diagram illustrating a row redundancy repair operation for a case where defects occur at both sense amplifiers of a second edge sub-block in a memory device having an open bit line sense amplifier according to another exemplary embodiment of the present invention, and FIG. 15 is a timing diagram illustrating a row redundancy repair process for a case where defects occur at both sense amplifiers of the second edge sub-block in FIG. 14.

FIG. 14 corresponds to a case where the left and right S/As of the second edge sub-block 120 are defective. The DQ data of the left S/A is repaired by the redundancy cell in the first main sub-block 110, the DQ data of the right S/A is repaired by the redundancy cell in the second main sub-block 130, and the first edge sub-block 100 and the dummy sub-block 140 are disabled, thereby preventing the overlapping DQ data from being generated.

Referring to FIGS. 14 and 15, a W/L address is inputted to a sub-block control circuit installed at each sub-block of the memory device (a-2). Here, the signals DXA8–10 and 11–12 in FIG. 6 among W/L addresses are inputted to the first edge sub-block control circuit 600 connected to the first edge sub-block 100, the second edge sub-block control circuit 800 connected to the second edge sub-block 120, and the dummy sub-block control circuit 700 connected to the dummy sub-block 140.

The signal PRREBL of a logic level 'LOW' is generated by cutting a fuse of the redundancy cell of the first main sub-block 110 (d-2), and the signal PRREBR of a logic level 'LOW' is generated by cutting a fuse of the redundancy cell of the second main sub-block 130 (b-2). The redundancy cells 112 and 132 are enabled (j-2).

Referring to FIG. 6, the signals DXA8–10 and 11–12 are inputted to the NAND gate 601, the NAND gate 601 outputs a logic level 'LOW', and the inverter 605 receives the signal PRREBL of a logic level 'LOW' to output a logic level 'HIGH'. Consequently, the signal PNWERESET of the first edge sub-block control circuit 600 has a logic level 'HIGH' (f-2), and the signal PBLKSI of a logic level 'LOW' is outputted to the first edge sub-block 100 (e-2). Accordingly, because the signal PNWERESET of the first edge sub-block control circuit 600 has a logic level 'HIGH', the W/L 111 of the first edge sub-block 100 is disabled (g-2), and the signal PBLKSI of a logic level 'LOW' is outputted to disable an equalizer and an S/A of the first edge sub-block 100 (h-2).

Referring to FIG. 7, the signals DXA8–10 and 11–12 are inputted to the NAND gate 701, the NAND gate 701 outputs a logic level 'LOW', and the inverter 705 receives the signal PRREBR of a logic level 'LOW' to output a logic level 'HIGH'. Consequently, the signal PNWERESET of the first edge sub-block control circuit 700 has a logic level 'HIGH' (f-2), and the signal PBLKSI of a logic level 'LOW' is outputted to the dummy sub-block 140 (e-2). Accordingly, because the signal PNWERESET of the dummy edge sub-block control circuit 700 has a logic level 'HIGH', the W/L 142 of the dummy sub-block 140 is disabled (g-2), and the signal PBLKSI of a logic level 'LOW' is outputted to the dummy sub-block 140 to disable an equalizer and an S/A of the dummy sub-block 140 (h-2).

Referring again to FIG. 8, the signals DXA8–10 and 11–12 are inputted to the NAND gate 801, the NAND gate 801 outputs a logic level 'LOW', the NOR gate 805 receives the signal PRREBL of a logic level 'LOW' and the signal PRREBR of a logic level 'LOW' to output a logic level 'HIGH', and the signal PBLKSI of a logic level 'LOW' is outputted to the second edge sub-block 120 (k-2).

Referring to FIG. 9, the NOR gate 901 receives the signal PBLKSI (k-2) of a logic level 'LOW' and the signal PBLKSJ (m-2) of a logic level 'LOW' to output a logic level 'HIGH', and the signal PBLKSIJ_CNTR_PXI becomes a logic level 'LOW' (l-2). Consequently, a W/L of the second edge sub-block 120 is disabled.

Referring to FIG. 10, the OR gate 1003 receives the signal PRREBL of a logic level 'LOW' and the signal PREDI of a logic level 'LOW' to output a logic level 'LOW'. The OR gate 1001 receives the signal PBLKSI of a logic level 'LOW' and the signal PBLKSJ of a logic level 'LOW' to output a logic level 'LOW'. The NAND gate 1005 outputs a logic level 'HIGH'. Consequently, the signal PBLKSIJ_CNTR becomes a logic level 'LOW'. Accordingly, an equalizer and a left S/A of the second edge sub-block 100 are disabled (o-2).

Referring to FIG. 11, the OR gate 1003 receives the signal PRREBR of a logic level 'LOW' and the signal PREDI (n-2) of a logic level 'LOW' to output a logic level 'LOW'. The OR gate 1001 receives the signal PBLKSI of a logic level 'LOW' and the signal PBLKSJ (m-2) of a logic level 'LOW' to output a logic level 'LOW'. The NAND gate 1005 outputs a logic level 'HIGH'. Consequently, the signal PBLKSIJ_CNTR becomes a logic level 'LOW'. Accordingly, an equalizer and a right S/A of the second edge sub-block 100 are disabled (o-2).

Consequently, the row redundancy repair method for a case where defects occur at the both S/As of the second edge sub-block 120 enables the W/L 111 of the first edge sub-block 100 and the W/L 142 of the dummy sub-block 140 and disables the equalizer and the left and right S/As of the second edge sub-block 120, so as to block the DQ data 1, 3, 4 and 6 overlapped due to the redundancy cell.

Figure 16:
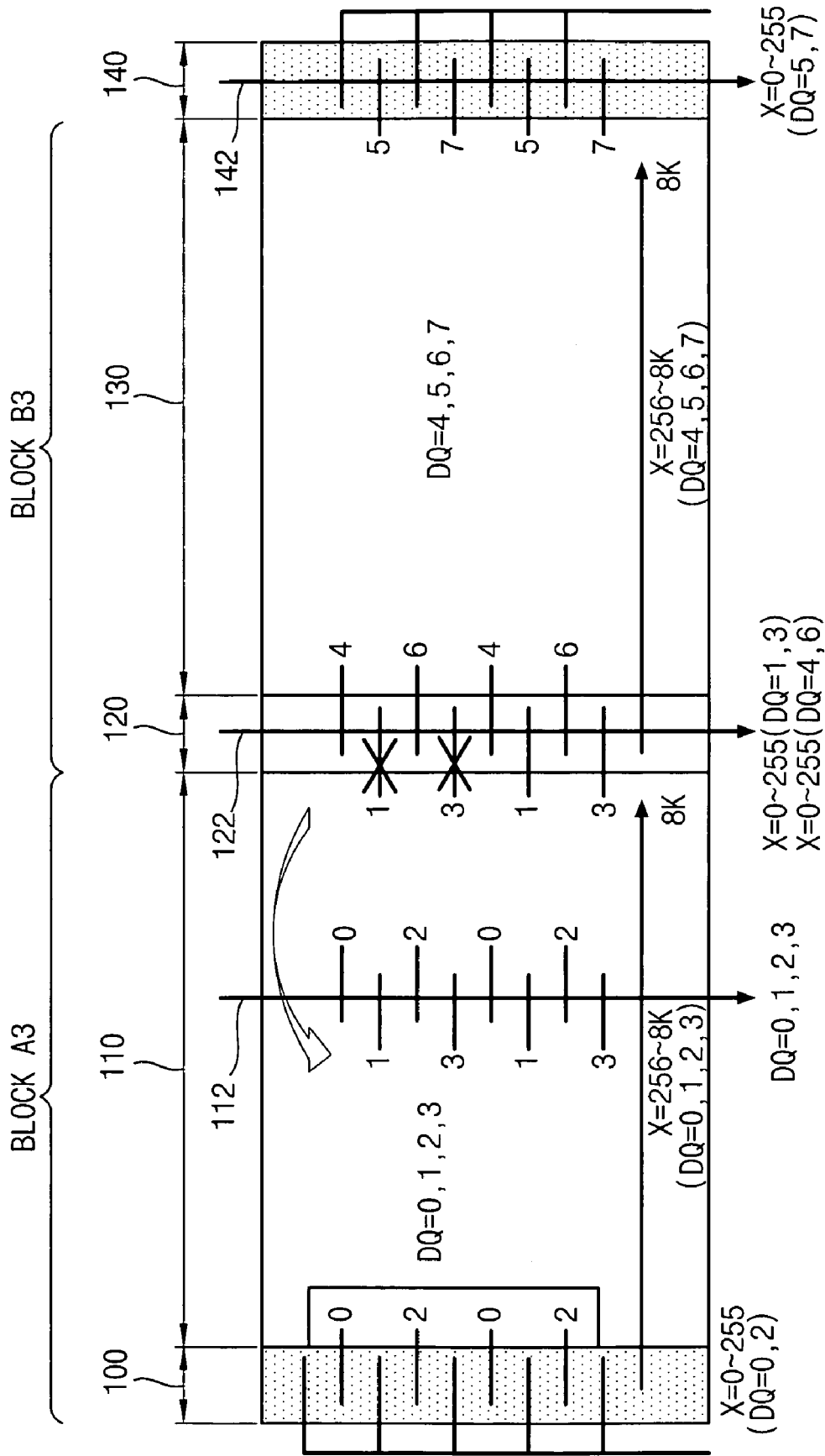
FIG. 16 schematically illustrates a row redundancy repair method according to an exemplary embodiment of the invention, when defects occur at one sense amplifier of a second edge sub-block in a memory device having an open bit line sense amplifier.
Figure 17:
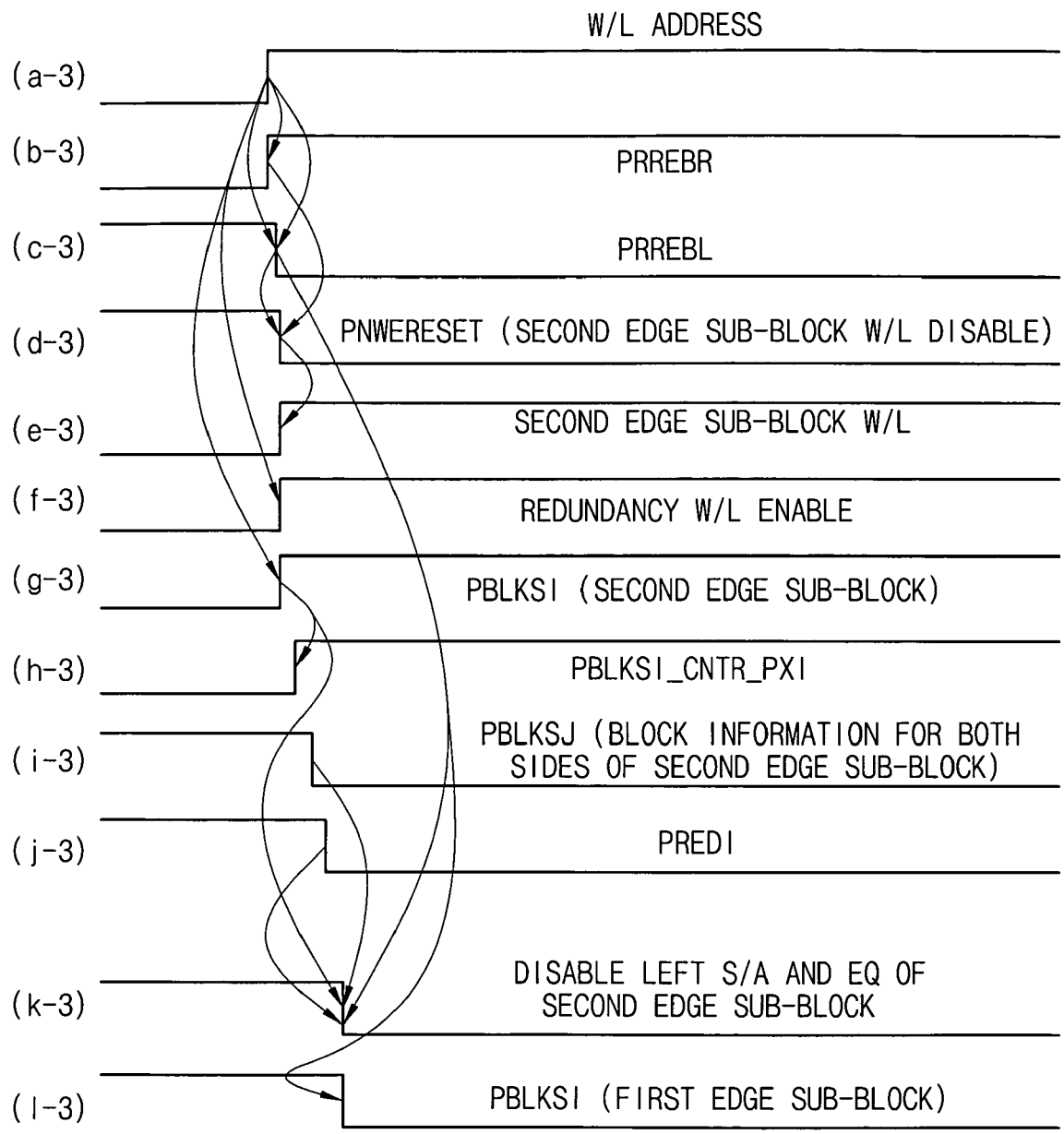
FIG. 17 is a timing diagram that illustrates a row redundancy repair process according to an exemplary embodiment of the invention, when defects occur at one sense amplifier of the second edge sub-block in FIG. 16

FIG. 16 is a conceptual diagram illustrating a row redundancy repair operation for a case where defects occur at one sense amplifier of a second edge sub-block in a memory device having an open bit line sense amplifier, according to another exemplary embodiment of the present invention, and FIG. 17 is a timing diagram illustrating a row redundancy repair process for a case where defects occur at one sense amplifier of the second edge sub-block in FIG. 16.

FIG. 16 illustrates a case where the left S/A of the second edge sub-block 120 are defective. The DQ data of the left S/A is repaired by the redundancy cell in the first main sub-block 110, and the first edge sub-block 100 is disabled, thereby preventing the overlapping DQ data from being generated. Also, the W/L 122 of the second edge sub-block 120 is enabled, and the DQ data 1 and 3 of the left S/A of the second edge sub-block 120 are blocked.

Referring to FIGS. 16 and 17, a W/L address is inputted to a sub-block control circuit installed at each sub-block of the memory device (a-3). Here, the signals DXA8–10 and 11–12 in FIG. 6 among W/L addresses are inputted to the first edge sub-block control circuit 600 connected to the first edge sub-block 100, and the second edge sub-block control circuit 800 connected to the second edge sub-block 120.

The signal PRREBL of a logic level 'LOW' is generated by cutting a fuse of the redundancy cell of the first main sub-block 110 (c-3), and the signal PRREBR of a logic level 'HIGH' is generated by not cutting a fuse of the redundancy cell of the second main sub-block 130 (b-3). The redundancy cell is enabled (f-3).

Referring to FIG. 6, the signals DXA8–10 and 11–12 are inputted to the NAND gate 601, the NAND gate 601 outputs a logic level 'LOW', and the inverter 605 receives the signal PRREBL of a logic level 'LOW' to output a logic level 'HIGH'. Consequently, the signal PNWERESET (d-3) of the first edge sub-block control circuit 600 has a logic level 'HIGH', and the signal PBLKSI of a logic level 'LOW' is outputted to the first edge sub-block 100. Accordingly, because the signal PNWERESET of the first edge sub-block control circuit 600 has a logic level 'HIGH', the W/L 111 of the first edge sub-block 100 is disabled, and the signal PBLKSI of a logic level 'LOW' is outputted to disable an equalizer and an S/A of the first edge sub-block 100.

Referring again to FIG. 8, the signals DXA8–10 and 11–12 are inputted to the NAND gate 801, the NAND gate 801 outputs a logic level 'LOW', the NOR gate 805 receives the signal PRREBL of a logic level 'LOW' and the signal PRREBR of a logic level 'HIGH' to output a logic level 'LOW', and the signal PBLKSI of a logic level 'HIGH'is outputted to the second edge sub-block 120 (g-3).

Referring to FIG. 9, the NOR gate 901 receives the signal PBLKSI of a logic level 'HIGH' and the signal PBLKSJ (i-3) of a logic level 'LOW' to output a logic level 'LOW', and the signal PBLKSIJ_CNTR_PXI becomes a logic level 'HIGH' (h-3). Consequently, a W/L of the second edge sub-block 120 is enabled.

Referring to FIG. 10, the OR gate 1003 receives the signal PRREBL of a logic level 'LOW' and the signal PREDI of a logic level 'LOW' to output a logic level 'LOW'. The OR gate 1001 receives the signal PBLKSI of a logic level 'HIGH' and the signal PBLKSJ of a logic level 'LOW' to output a logic level 'HIGH'. The NAND gate 1005 outputs a logic level 'LOW'. Consequently, the signal PBLKSIJ_CNTR becomes a logic level 'LOW'. Accordingly, an equalizer and a left S/A of the second edge sub-block 120 are disabled (k-3).

Referring to FIG. 11, the OR gate 1003 receives the signal PRREBR of a logic level 'LOW' and the signal PREDI of a logic level 'LOW' to output a logic level 'LOW'. The OR gate 1001 receives the signal PBLKSI of a logic level 'LOW' and the signal PBLKSJ of a logic level 'LOW' to output a logic level 'LOW'. The NAND gate 1005 outputs a logic level 'HIGH'. Consequently, the signal PBLKSIJ_CNTR becomes a logic level 'LOW'. Accordingly, an equalizer and a right S/A of the second edge sub-block 100 are disabled.

With the above exemplary repair method, the first edge sub-block 100, the second edge sub-block 120 and the dummy sub-block 140 may not have a redundancy cell. Even when a redundancy cell is provided, it may be prevented from being used as a redundancy by not installing a fuse therein.

Also, when the second edge sub-block 120 is repaired, a redundancy cell is not used at the left/right neighboring sub-blocks of the second edge sub-block 120. The reason for this is that when the neighboring sub-blocks are used for the redundancy during the repairing of the second edge sub-block 120, the signal of a logic level 'HIGH' is generated at a fuse being used and thus the signal PBLKSIJ of the second edge sub-block 120 becomes a logic level 'HIGH', thereby enabling the S/A and the equalizer.

As described above, when defects occur at the edge sub-block or the dummy sub-block, the repair operation is performed using the redundancy cell of a block other than the edge sub-block and the dummy sub-block. When N redundancy cells exit in the edge sub-block or the dummy sub-block and defects more than the number N occur at the edge sub-block or the dummy sub-block, it is possible to prevent a decrease in repair efficiency due to a difficulty in the repair process. Consequently, it is possible to perform the repair process for the memory device in the edge sub-block or the dummy sub-block with the same repair efficiency as in a case where defects occur at the main sub-block.

While the present invention has been described with reference to the example embodiments, it will be apparent to those skilled in the art that various changes and modifications may be made without departing from the spirit and scope of the invention as defined in the following claims.

We claim:

1. A method of repairing a semiconductor memory device having an open bit line architecture when three word lines of a cell array block are enabled substantially at the same time, the method comprising:
   selecting a redundancy cell for replacing a defective memory cell coupled to one of the three word lines;
   determining whether to enable a word line coupled to the defective memory cell;
   disabling a sense amplifier coupled to the defective memory cell;
   determining whether to enable a word line of a memory cell corresponding to a bit line that is repeatedly selected due to a replacement by the redundancy cell;
   disabling a sense amplifier of the memory cell corresponding to the repeatedly selected bit line; and
   disabling the redundancy cell.

2. The method of claim 1, wherein the cell array block includes a first block, a second block, and a dummy sub-block.

3. The method of claim 2, wherein the enabled three word lines include a word line of the dummy sub-block.

4. The method of claim 3, wherein the first block includes a first edge sub-block and a first main sub-block, and the second block includes a second edge sub-block and a second main sub-block.

5. The method of claim 1, wherein when a row address corresponds to the defective memory cell coupled to one of the three word lines, the method further comprising generating a redundancy select signal for selecting the redundancy cell for replacing the defective memory cell during the selecting of the redundancy cell.

6. The method of claim 5, wherein the redundancy select signal is generated when a fuse of the redundancy cell is disconnected.

7. The method of claim 5, wherein the step of determining whether to enable the word line includes generating a first word line control signal to enable or disable the word line coupled to the defective memory cell based on the row address and the redundancy select signal.

8. The method of claim 7, wherein the step of disabling a sense amplifier coupled to the defective memory cell includes generating a first sense amplifier control signal for disabling a sense amplifier coupled to the defective memory cell based on the row address and the redundancy select signal.

9. The method of claim 8, wherein the step of determining whether to enable a word line of a memory cell corresponding to the repeatedly selected bit line includes generating a second word line control signal to enable or disable said word line of the memory cell corresponding to the repeatedly selected bit line, based on the redundancy select signal and the first sense amplifier control signal.

10. The method of claim 9, wherein the step of disabling a sense amplifier of the memory cell corresponding to the repeatedly selected bit line comprises generating a second sense amplifier control signal for disabling the sense amplifier of the memory cell corresponding to the repeatedly-selected bit line based on at least one of the row address, the redundancy signal and the first sense amplifier control signal.

11. The method of claim 10, wherein the redundancy cell is not selected in sub-blocks neighboring both sides of the second edge sub-block.

12. The method of claim 11, wherein when a defect occurs at a memory cell in the first edge sub-block, the method further comprising:
  enabling the redundancy cell selected in the first main sub-block;
  disabling a word line of a defective memory cell of the first edge sub-block in response to the row address and the redundancy select signal;
  disabling a sense amplifier of the defective memory cell of the first edge sub-block in response to the row address and the redundancy select signal;
  enabling a word line of a first memory cell in the second edge sub-block corresponding to a bit line overlapping with the bit line coupled to the redundancy cell for a defective memory cell of the first edge sub-block; and
  disabling a sense amplifier of the first memory cell.

13. The method of claim 11, wherein when a defect occurs at a memory cell in the dummy sub-block, the method further comprising:
  enabling the redundancy cell selected in the second main sub-block;
  disabling a word line of a defective memory cell of th dummy sub-block in response to the row address and the redundancy select signal;
  disabling a sense amplifier of the defective memory cell of the dummy sub-block in response to the row address and the redundancy select signal;
  enabling a word line of a first memory cell in the dummy sub-block corresponding to a bit line overlapping with a bit line coupled to a redundancy cell for a defective memory cell of the first edge sub-block; and
  disabling a sense amplifier of the first memory cell.

14. The method of claim 11, wherein when defects occur at both side sense amplifiers of a memory cell in the second edge sub-block, the method further comprising:
  enabling a first redundancy cell selected in the first main sub-block and enabling a second redundancy cell selected in the second main sub-block;
  disabling a word line of a defective memory cell of the second edge sub-block in response to the row address and the redundancy select signal;
  disabling a word line of a first memory cell in the first edge sub-block corresponding to a bit line overlapping with a bit line coupled to the first redundancy cell;
  disabling a word line of a second memory cell in the dummy sub-block corresponding to a bit line overlapping with a bit line coupled to the second redundancy cell; and
  disabling both sense amplifiers of a defective memory cell of the second edge sub-block.

15. The method of claim 11, wherein when defects occur at one sense amplifier of a memory cell in the second edge sub-block, the method further comprising:
  enabling a first redundancy cell selected in the first main sub-block;
  enabling a word line of a defective memory cell of the second edge sub-block in response to the row address and the redundancy select signal;
  disabling a word line of a first memory cell in the first edge sub-block corresponding to a bit line overlapping with a bit line coupled to the first redundancy cell; and
  disabling the one sense amplifier of a defective memory cell of the second edge sub-block.

16. The method of claim 1, further comprising applying a straight edge block method to process a dummy line at an edge block of the cell array block.

17. An apparatus for repairing a semiconductor memory device having an open bit line architecture when three word lines of a cell array block are enabled substantially at the same time, the cell array block including a first block having a first edge sub-block and a first main sub-block, a second block having a second edge sub-block and a second main sub-block, and a dummy sub-block, the apparatus comprising:
  a first edge sub-block control circuit which generates a first word line control signal to disable a first word line of the first edge sub-block, and which generates a first sense amplifier control signal to disable a first sense amplifier coupled to the first word line of the first edge sub-block, based on a row address and a redundancy select signal for selecting a redundancy cell for replacing a defective memory cell;
  a dummy sub-block control circuit which generates a second word line control signal to disable a second word line of the dummy sub-block, and which generates a second sense amplifier control signal to disable a second sense amplifier coupled to a second word line of the dummy sub-block, based on the row address and the redundancy select signal;
  a word line control circuit of the second edge sub-block, which generates a third word line control signal to determine if a third word line of the second edge sub-block should be enabled; and
  a sense amplifier control circuit of the second edge sub-block, which generates a third sense amplifier control signal to disable a third sense amplifier coupled to a first side of the third word line of the second edge sub-block, and which generates a fourth sense amplifier control signal to disable a fourth sense amplifier coupled to a second side of the third word line of the second edge sub-block.

18. The apparatus of claim 17, wherein the enabled three word lines includes a word line of the dummy sub-block.

* * * * *